(12) United States Patent
Miller

(10) Patent No.: US 9,605,341 B2
(45) Date of Patent: Mar. 28, 2017

(54) PHYSICAL VAPOR DEPOSITION RF PLASMA SHIELD DEPOSIT CONTROL

(71) Applicant: APPLIED MATERIALS, INC., Santa Clara, CA (US)

(72) Inventor: Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 802 days.

(21) Appl. No.: 13/786,866

(22) Filed: Mar. 6, 2013

(65) Prior Publication Data

US 2014/0251789 A1 Sep. 11, 2014

(51) Int. Cl.
C23C 14/34 (2006.01)
C23C 14/35 (2006.01)
H01J 37/32 (2006.01)
H01J 37/34 (2006.01)

(52) U.S. Cl.
CPC .......... *C23C 14/35* (2013.01); *C23C 14/3471* (2013.01); *C23C 14/354* (2013.01); *H01J 37/3266* (2013.01); *H01J 37/32256* (2013.01); *H01J 37/32623* (2013.01); *H01J 37/32651* (2013.01); *H01J 37/32669* (2013.01); *H01J 37/3402* (2013.01); *H01J 37/3447* (2013.01)

(58) Field of Classification Search
CPC ............... C23C 14/3471; C23C 14/354; H01J 37/32256; H01J 37/3447
See application file for complete search history.

(56) References Cited

U.S. PATENT DOCUMENTS

| 4,954,212 | A * | 9/1990 | Gabriel | H01J 37/32935 156/345.25 |
| 5,478,459 | A * | 12/1995 | Latz | G11B 7/26 204/298.16 |
| 5,558,749 | A * | 9/1996 | Yokoyama | H01J 37/3408 204/192.12 |
| 6,254,745 | B1 * | 7/2001 | Vukovic | H01J 37/32688 204/298.06 |
| 6,743,340 | B2 * | 6/2004 | Fu | C23C 14/14 204/192.12 |
| 2005/0155854 | A1 * | 7/2005 | Shufflebotham | B01D 53/70 204/164 |
| 2013/0008778 | A1 * | 1/2013 | Hoffman | C23C 14/35 204/192.25 |

OTHER PUBLICATIONS

U.S. Appl. No. 13/749,791, filed Jan. 25, 2013, Ge et al.
U.S. Appl. No. 13/750,318, filed Jan. 25, 2013, Cao et al.
U.S. Appl. No. 13/761,253, filed Feb. 17, 2013, Ritchie et al.

* cited by examiner

*Primary Examiner* — Jason M Berman
(74) *Attorney, Agent, or Firm* — Moser Taboada; Alan Taboada

(57) ABSTRACT

Methods and apparatus for processing a substrate in a physical vapor deposition (PVD) chamber are provided herein. In some embodiments, a process kit shield used in a substrate processing chamber may include a shield body having an inner surface and an outer surface, a process kit shield impedance match device coupled between the shield body and ground, wherein the process kit shield impedance match device is configured to adjust a bias voltage of the process kit shield, a cavity formed on the outer surface of the shield body, and one or more magnets disposed within the cavity.

16 Claims, 6 Drawing Sheets

PHYSICAL VAPOR DEPOSITION RF PLASMA SHIELD DEPOSIT CONTROL

FIELD

Embodiments of the present invention generally relate to apparatus and methods used in physical vapor deposition (PVD) chambers.

BACKGROUND

In a PVD chamber, films of material may be deposited on a substrate during processing. For example, titanium nitride (TiN) films may deposited by radio frequency (RF) plasma (13 or 40 MHz, 1-10 kW) sputtering at pressure (50-150 mT) and low sheath voltage (<50 V) at the wafer. Process parameters and operating environment is typically control to provide PVD films of good density but low stress. Controlling the sheath voltage is important to minimize the film stress. High sheath voltage over-densifies the film and creates a compressive film stress. Low sheath voltage minimizes this tendency towards over-densification.

In some PVD processing chambers, RF capacitive tuning circuits have been used to increase the substrate potential to a positive DC value. This has the by-product of also increasing the DC potential of the plasma. Since the chamber shields are at ground potential, this voltage difference increases the likelihood to sputter material from the shields and contaminate the plasma, and therefore the substrate. This problem becomes more apparent at higher frequencies such as 40 MHz and up, and when shield areas are reduced, thereby concentrating the field.

Accordingly, the inventor has provided an improved apparatus and methods for a controlling the sheath voltage by raising or lowering the overall plasma potential.

SUMMARY

Methods and apparatus for processing a substrate in a physical vapor deposition (PVD) chamber are provided herein. In some embodiments, a process kit shield used in a substrate processing chamber may include a shield body having an inner surface and an outer surface, a process kit shield impedance match device coupled between the shield body and ground, wherein the process kit shield impedance match device is configured to adjust a bias voltage of the process kit shield, a cavity formed on the outer surface of the shield body, and one or more magnets disposed within the cavity.

In some embodiments, an apparatus for use in a physical vapor deposition (PVD) chamber includes a chamber body, a target disposed in the chamber body, the target comprising material to be deposited on a substrate when present, a substrate support pedestal disposed within the chamber body to support the substrate opposite the target during processing, a process kit shield disposed within the chamber body, a plurality of process kit shield impedance match devices disposed equidistantly from each other about the perimeter of the process kit shield, wherein each of the plurality of process kit shield impedance match devices is coupled between the process kit shield and ground, and a plurality of dielectric isolators configured to electrically isolate the process kit shield from other components of the substrate processing chamber.

In some embodiments, a method of processing a substrate in a physical vapor deposition (PVD) chamber, the PVD chamber having a target, a process kit shield and a substrate support pedestal disposed in the chamber, includes applying RF power at a first frequency from a first RF power source to the target comprising a metal disposed in the PVD chamber above the substrate to form a plasma from a plasma-forming gas, sputtering metal atoms from the target onto the substrate using the plasma, and controlling plasma sheath voltage during sputtering process by controlling an impedance of the process kit shield using a variable capacitance tuner coupled between the process kit shield and ground.

Other and further embodiments of the inventive methods are discussed below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
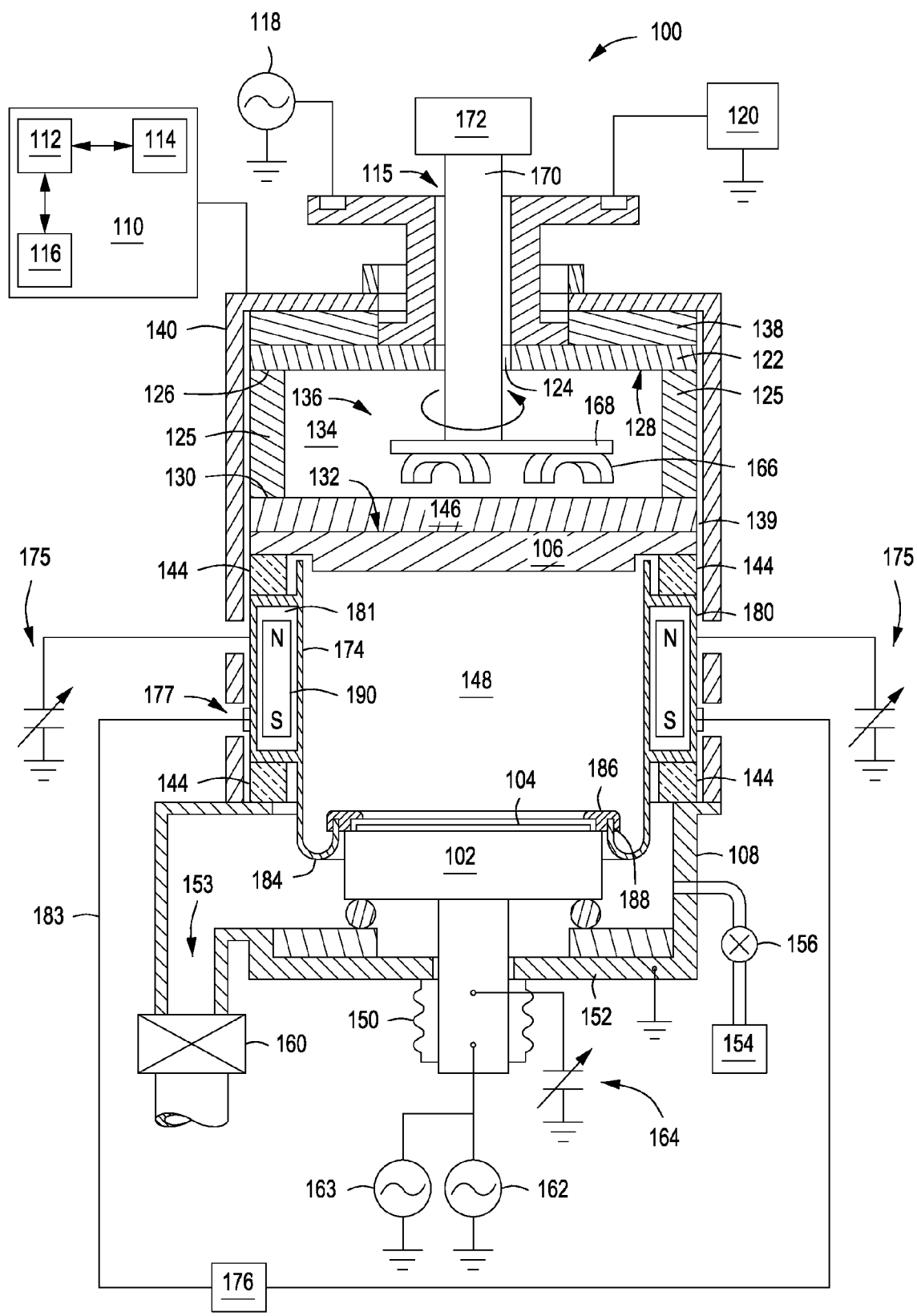
FIG. 1 depicts a schematic, cross-sectional view of a physical vapor deposition (PVD) chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide an apparatus for a controlling the sheath voltage in a PVD chamber by raising or lowering the overall plasma potential. In some embodiments, a capacitive tuning circuit coupled to the process shields can enable another hardware knob to tune the RF plasma, thereby controlling the sheath voltage. A capacitively tuned shield could be used to tune the center-to-edge uniformity of the plasma by raising or lowering the overall plasma potential. It could also be used to clean deposit from shield by sputtering. Furthermore, embodiments of a capacitively tuned shield described herein could be used to densify the deposited material on the shields.

FIG. 1 depicts a schematic, cross-sectional view of a physical vapor deposition chamber (process chamber 100) in accordance with some embodiments of the present invention. Examples of suitable PVD chambers are commercially available from Applied Materials, Inc., of Santa Clara, Calif. Other process chambers from other manufactures may also benefit from the inventive apparatus disclosed herein. The exemplary chambers described below may be used to process 200 mm, 300 mm, and 450 mm substrates, although other sized substrates may also be used.

The process chamber 100 contains a substrate support pedestal 102 for receiving a substrate 104 thereon, and a sputtering source, such as a target 306. The substrate support pedestal 102 may be located within a grounded enclosure wall 108, which may be a chamber wall or a grounded shield (a ground shield 140 is shown covering at least some portions of the chamber 100 above the target 106. In some embodiments, the ground shield 140 could be extended below the target to enclose the pedestal 102 as well.).

The target 106 comprises a material to be deposited on the substrate 104 during sputtering, such a metal or metal oxide. In some embodiments, the backing plate 146 may be coupled to the source distribution plate-facing surface 132 of the target 106. The backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106.

The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in a central region 148 of the process chamber 100. The central region 148 is defined as the region above the substrate support pedestal 102 during processing (for example, between the target 106 and the substrate support pedestal 102 when in a processing position).

In some embodiments, the substrate support pedestal 102 may be vertically movable through a bellows 150 connected to a bottom chamber wall 152 to allow the substrate 104 to be transferred onto the substrate support pedestal 102 through a load lock valve (not shown) in the lower portion of processing the chamber 100 and thereafter raised to a deposition, or processing position. One or more processing gases may be supplied from a gas source 154 through a mass flow controller 156 into the lower part of the chamber 100. An exhaust port 153 may be provided and coupled to a pump (not shown) via a valve 160 for exhausting the interior of the process chamber 100 and facilitating maintaining a desired pressure inside the process chamber 100.

An RF bias power source 162 may be coupled to the substrate support pedestal 102 in order to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHz, for example, non-limiting frequencies such as 2 MHz, 13.56 MHz, 40 MHz or 60 MHz can be used. Further, a second RF bias power source 163 may be coupled to the substrate support pedestal 102 and provide any of the frequencies discussed above for use with the RF bias power source 162. In other applications, the substrate support pedestal 102 may be grounded or left electrically floating. For example, a capacitance tuner 164 may be coupled to the substrate support pedestal for adjusting voltage on the substrate 104 for applications where RF bias power may not be desired.

In some embodiments, the chamber 100 may further include a process kit shield 174 supported in the process chamber 100 by isolators 144. In some embodiments, the isolators 144 electrically isolate the process kit shield 174 from other components of the chamber 100. The isolators 144 may be formed from dielectric material such as a ceramic, a plastic, or the like. In some embodiments, the isolators 144 may form a seal to prevent the escape of process gases or the introduction of outside contaminants into the processing volume of the central region 148. In some embodiments, a gap 180 may be disposed between the inner diameter of the ground shield 140 and chamber walls 108 and the outer diameter of the body of the process kit shield 174 and be wide enough to provide electrical isolation.

Generally, the process kit shield 174 extends downwardly along the walls 108 and 140 to below an upper surface of the substrate support pedestal 102 and returns upwardly until reaching an upper surface of the substrate support pedestal 102 (e.g., forming a u-shaped portion 184 at the bottom). Alternatively, the bottommost portion of the process kit shield need not be a u-shaped portion 184 and may have any suitable shape. A cover ring 186 rests on the top of an upwardly extending lip 188 of the process kit shield 174 when the substrate support pedestal 102 is in its lower, loading position but rests on the outer periphery of the substrate support pedestal 102 when it is in its upper, deposition position to protect the substrate support pedestal 102 from sputter deposition. An additional deposition ring (not shown) may be used to shield the periphery of the substrate 104 from deposition.

In some embodiments, a process kit shield impedance match device 175 may be coupled to the process kit shield 174 for adjusting the impedance or bias voltage on the shield 174. The process kit shield impedance match device 175 may be advantageously utilized, for example, to direct ion flow towards the shield 174 and/or in combination with the capacitance tuner 164 to control the energy and direction of ion flow. The process kit shield impedance match device 175 may also be used for advantageously controlling the sheath voltage in a PVD chamber by raising or lowering the overall plasma potential. In some embodiments, the process kit shield impedance match device 175 may be a capacitive tuner coupled between the process kit shield body and ground. In some embodiments, the capacitive tuning process kit shield impedance match device 175 coupled to the process shields can adjusted via a hardware knob to tune the RF plasma, thereby controlling the sheath voltage. A capacitively tuned shield 174/175 could be used to tune the center-to-edge uniformity of the plasma by raising or lowering the overall plasma potential. It could also be used to clean deposit from shield by sputtering. Furthermore, embodiments of a capacitively tuned shield described herein could be used to densify the deposited material on the shields.

Figure 2A:
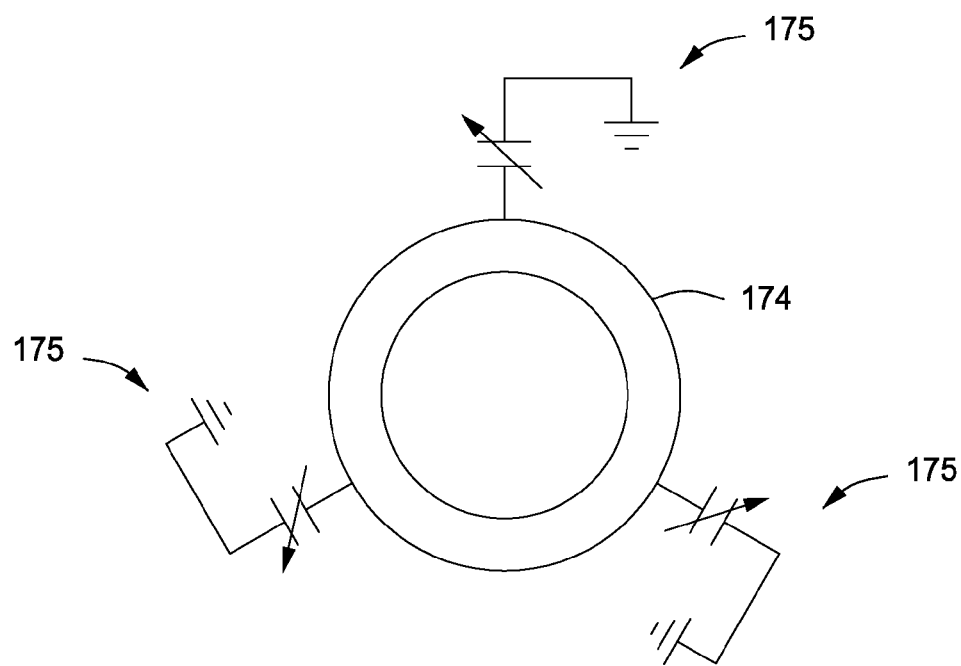
FIGS. 2A-B depict schematic top-down views of process kit shield impedance match devices in accordance with some embodiments of the present invention.
Figure 2B:
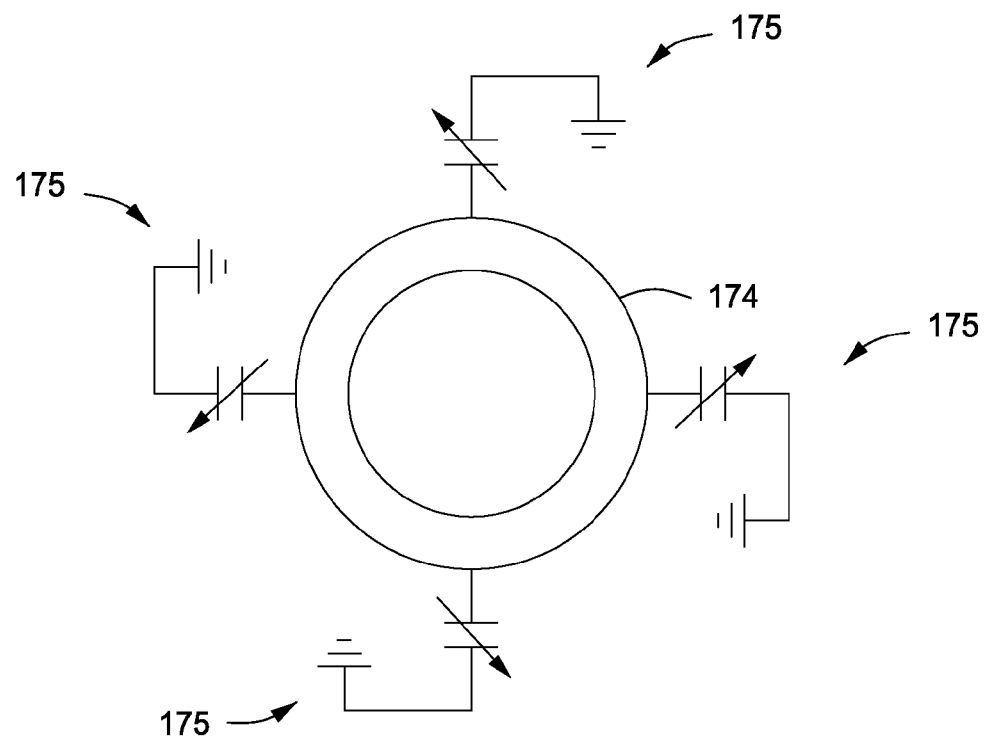

In some embodiments, the process kit shield impedance match device 175 may be a plurality of process kit shield impedance match devices 175 disposed equidistantly from each other about the perimeter of the process kit shield 174, wherein each of the plurality of process kit shield impedance match devices is coupled between the shield body and ground. For example, as shown in FIG. 2A, three process kit shield impedance match devices 175 are coupled to the perimeter of the process kit shield 174 and are equidistantly spaced apart from each other. In FIG. 2B, four process kit shield impedance match devices 175 are shown coupled to the perimeter of the process kit shield 174 and are equidistantly spaced apart from each other.

Figure 3A:
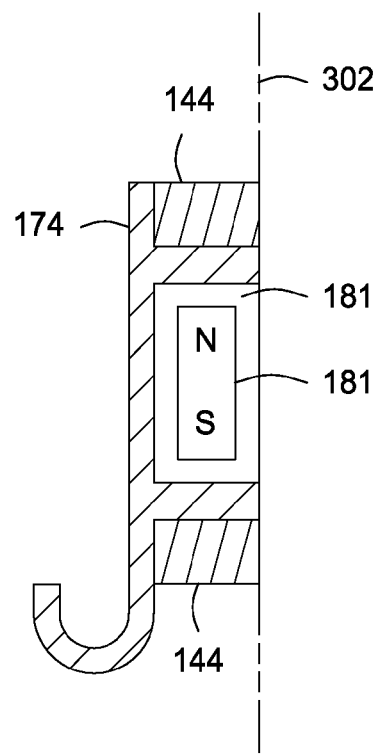
FIGS. 3A-B depict schematic cross-sectional side views of exemplary process kit shields in accordance with some embodiments of the present invention.
Figure 3B:
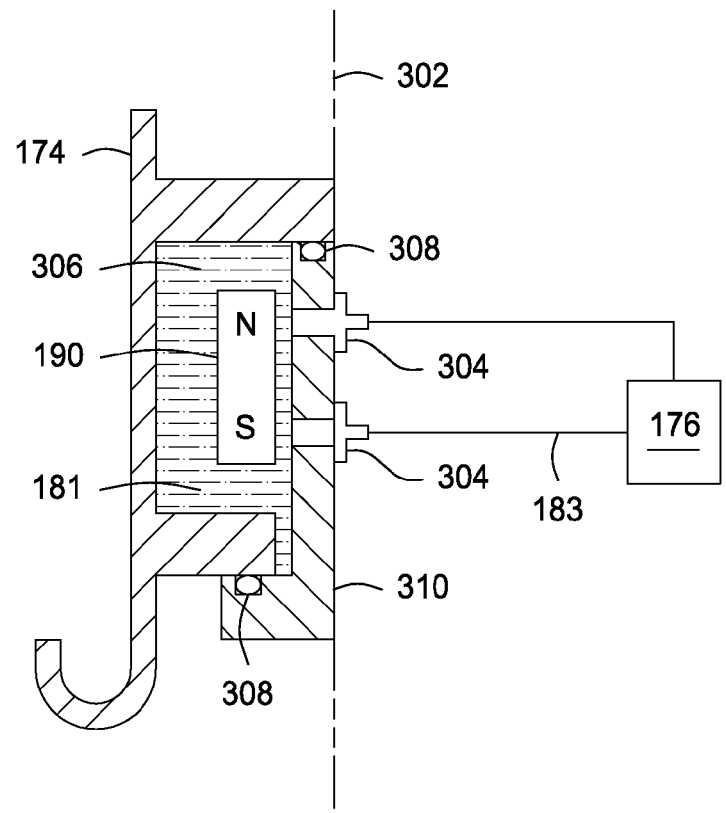

In some embodiments, as shown in FIGS. 1 and 3A, a cavity 181 may be formed on the outer surface of the shield body. In some embodiments, one or more magnets 190 may be disposed within the cavity 181. The one or more magnets 190 and process kit shield may be cooled in a number of ways. In some embodiments, the one or more magnets 190 and process kit shield may be air cooled. In other embodiments, the one or more magnets 190 and process kit shield may be cooled by a coolant flowed into cavity 181 as depicted in FIGS. 1 and 3B. A cover plate 310 disposed over the cavity may seal the cavity 181 and have at least one fluid port 304 configured to flow a coolant 306 into and out of the cavity 181. The cover plate may include one or more recesses 308 with sealing devices (e.g., o-rings and the like) to fluidly seal the cover 310 and process kit shield 174. The coolant may be provided by a coolant source 176 via a conduit 183 that passes through an opening 177 in the ground shield 140 or other chamber wall 108. The conduit 183 may be coupled to the one or more fluid ports 304.

Figure 3C:
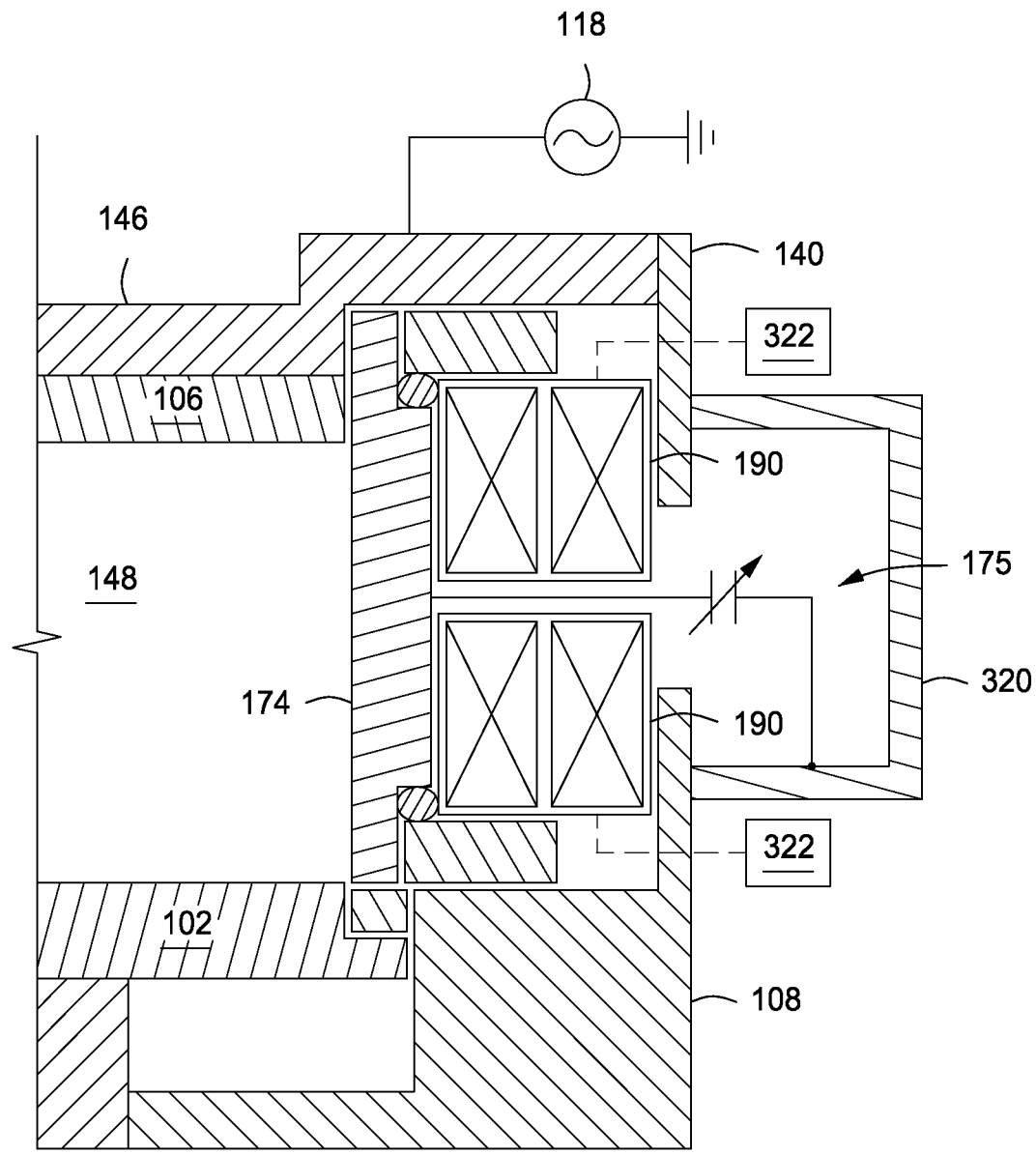
FIG. 3C depicts a schematic cross-sectional views of another exemplary process kit shield in accordance with some embodiments of the present invention.

In both FIGS. 3A and 3B, the magnets 190 are shown disposed in cavity 181 which is within the ground plane 302 defined by the ground return path formed by chamber walls 108 and ground shield 140. Since there are significant RF electric fields between the tuned shield and the ground plane, in some embodiments the magnetic windings are fully enclosed in a grounded metal box 320 to block these fields as shown in FIG. 3C and discussed below. Enclosing the magnets 190 in metal box 320 advantageously eliminates problems with the electromagnet windings of the magnets 190 caused by the significant RF electric fields between the tuned shield and the ground plane, in addition to reducing a risks of arcing and shorting. In FIG. 3C, magnets 190 are electromagnets that are connected to one or more power source 322 to control electromagnets 190.

The one or more magnets 190 may selectively provide a magnetic field between the substrate support pedestal 102, the process kit shield 174, and the target 106. In some embodiments, the one or more magnets 190 may be disposed additionally or alternatively in other locations, such as about the outside of the chamber wall 108 in a region just above the substrate support pedestal 102 when in processing position. The one or more magnets 190 may be an electromagnet and may be coupled to a power source (not shown) for controlling the magnitude of the magnetic field generated by the electromagnet.

In some embodiments, the plasma sheath voltage may be controlled by other methods. In some embodiments, the plasma sheath voltage may be controlled by controlling impedance between the substrate and ground, or by controlling impedance between the target and ground. For example, the chamber impedance can be controlled by a capacitance tuner coupled between the substrate support and ground, such as the capacitance tuner 164 discussed above and illustrated in FIG. 1, or the chamber impedance can be controlled by a capacitance tuner coupled between the target and ground (not shown).

In some embodiments, the plasma sheath voltage may be controlled by applying an RF energy to the substrate. For example, RF energy may be provided to the substrate 200 by one or more RF power supplies, such as a RF power supply 162 and/or 163 as discussed below and illustrated in FIG. 1. RF frequency of the RF energy provided to the substrate may range from about 2 to about 60 MHz. In some embodiments, the RF frequency may be set at one or more of 2, 13.56, 27.12, 40.68, or 60 MHz. The RF power of the RF energy provided to the substrate may range from about 50 to about 1000 Watts.

Referring back to FIG. 1, in some embodiments, the process chamber includes a feed structure for coupling RF and DC energy to the target 106. The feed structure is an apparatus for coupling RF and DC energy to the target, or to an assembly containing the target, for example, as described herein. A first end of the feed structure can be coupled to an RF power source 118 and a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, 40 MHz, or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 118 and the DC power source 120.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 122. The source distribution plate includes a hole 124 disposed through the source distribution plate 122 and aligned with a central opening of the feed structure. The source distribution plate 122 may be fabricated from suitable conductive materials to conduct the RF and DC energy from the feed structure.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is coupled to the central opening 115 of the body via the hole 124 of the source distribution plate 122. The cavity 134 and the central opening 115 of the body may be utilized to at least partially house one or more portions of a rotatable magnetron assembly 136 as illustrated in FIG. 1 and described further below. In some embodiments, the cavity may be at least partially filled with a cooling fluid, such as water ($H_2O$) or the like.

A ground shield 140 may be provided to cover the outside surfaces of the lid of the process chamber 100. The ground shield 140 may be coupled to ground, for example, via the ground connection of the chamber body. The ground shield 140 has a central opening to allow the feed structure to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 140 and may be an integral part of the ground shield 140 or a separate part coupled to the ground shield to provide grounding of the feed structure. The ground collar may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed and the body, thereby improving plasma, and processing, uniformity.

An isolator plate 138 may be disposed between the source distribution plate 122 and the ground shield 140 to prevent the RF and DC energy from being routed directly to ground. The isolator plate 138 has a central opening to allow the feed structure to pass through the isolator plate 138 and be coupled to the source distribution plate 122. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

A rotatable magnetron assembly 136 may be positioned proximate a back surface (e.g., source distribution plate-facing surface 132) of the target 106. The rotatable magnetron assembly 136 includes a plurality of magnets 166 supported by a base plate 168. The base plate 168 connects to a rotation shaft 170 coincident with the central axis of the chamber 100 and the substrate 104 as illustrated in FIG. 1. However, this design of the magnetron assembly is merely one exemplary embodiment. For example, other designs may include a rotatable magnetron assembly that is disposed off axis with respect to the central axis of the chamber and the substrate.

A motor 172 can be coupled to the upper end of the rotation shaft 170 to drive rotation of the magnetron assembly 136. The magnets 166 produce a magnetic field within the chamber 100, generally parallel and close to the surface of the target 106 to trap electrons and increase the local plasma density, which in turn increases the sputtering rate. The magnets 166 produce an electromagnetic field around the top of the chamber 100, and magnets 166 are rotated to rotate the electromagnetic field which influences the plasma density of the process to more uniformly sputter the target 106. For example, the rotation shaft 170 may make about 0 to about 150 rotations per minute.

A controller 110 may be provided and coupled to various components of the process chamber 100 to control the operation thereof. The controller 110 includes a central processing unit (CPU) 112, a memory 114, and support circuits 116. The controller 110 may control the process chamber 100 directly, or via computers (or controllers) associated with particular process chamber and/or support system components. The controller 110 may be one of any form of general-purpose computer processor that can be used in an industrial setting for controlling various chambers and sub-processors. The memory, or computer readable medium, 134 of the controller 110 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 116 are coupled to the CPU 112 for supporting the processor in a conventional manner. These circuits include cache, power supplies, clock circuits, input/output circuitry and subsystems, and the like. Inventive methods as described herein may be stored in the memory 114 as software routine that may be executed or invoked to control the operation of the process chamber 100 in the manner described herein. The software routine may also be stored and/or executed by a second CPU (not shown) that is remotely located from the hardware being controlled by the CPU 112.

Figure 4:
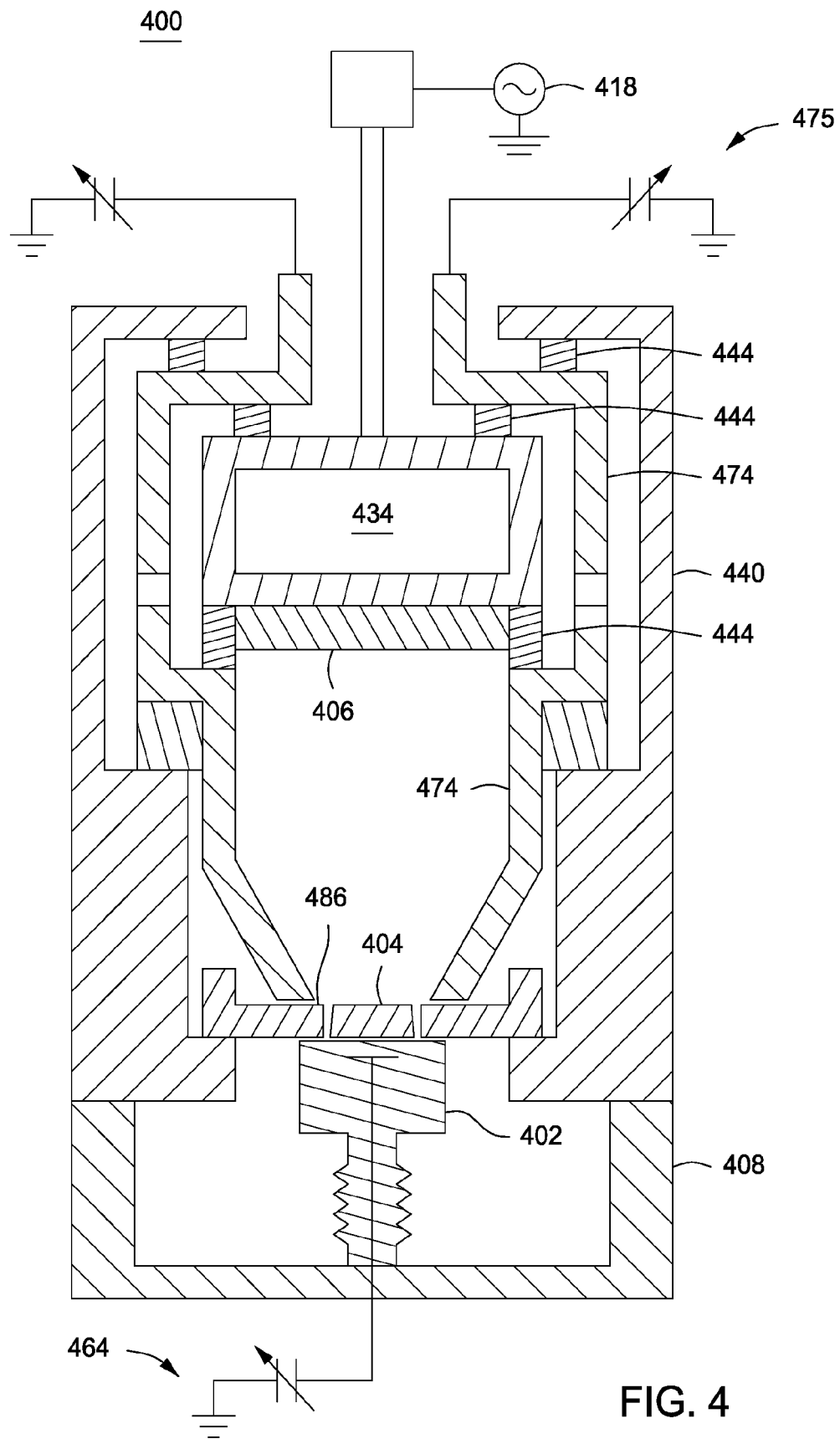
FIG. 4 depicts a schematic, cross-sectional view of another physical vapor deposition (PVD) chamber in accordance with some embodiments of the present invention.

FIG. 4 depicts a schematic cross-section of another exemplary PVD chamber 400 with a concentrically fed capacitively RF tuned shield. The process chamber 400 contains a substrate support pedestal 402 for receiving a substrate 404 thereon, and a sputtering source, such as a target 406. An RF power source 418 may be coupled to a central feed structure 434 for delivering power to an upper electrode. The substrate support pedestal 402 may be located within a grounded enclosure wall 408, which may be a chamber wall or a grounded shield (a ground shield 440 is shown covering at least some portions of the chamber 400 above the target 406. In some embodiments, the ground shield 440 could be extended below the target to enclose the pedestal 402 as well.). An edge ring 486 may be disposed on pedestal 402 about a periphery of a substrate disposed thereon.

The chamber 400 includes a process kit shield 474 supported in the process chamber 400 by isolators 444. In some embodiments, the isolators 444 electrically isolate the process kit shield 474 from other components of the chamber 400. In some embodiments, a process kit shield impedance match device 475 may be coupled to the process kit shield 474 for adjusting the impedance or bias voltage on the shield 474. The process kit shield impedance match device 475 may be advantageously utilized, for example, to direct ion flow towards the shield 474 and/or in combination with a capacitance tuner 464 to control the energy and direction of ion flow. The process kit shield impedance match device 475 may also be used for advantageously controlling the sheath voltage in a PVD chamber by raising or lowering the overall plasma potential. In some embodiments, the process kit shield impedance match device 475 may be a capacitive tuner coupled between the process kit shield body and ground.

Figure 5:
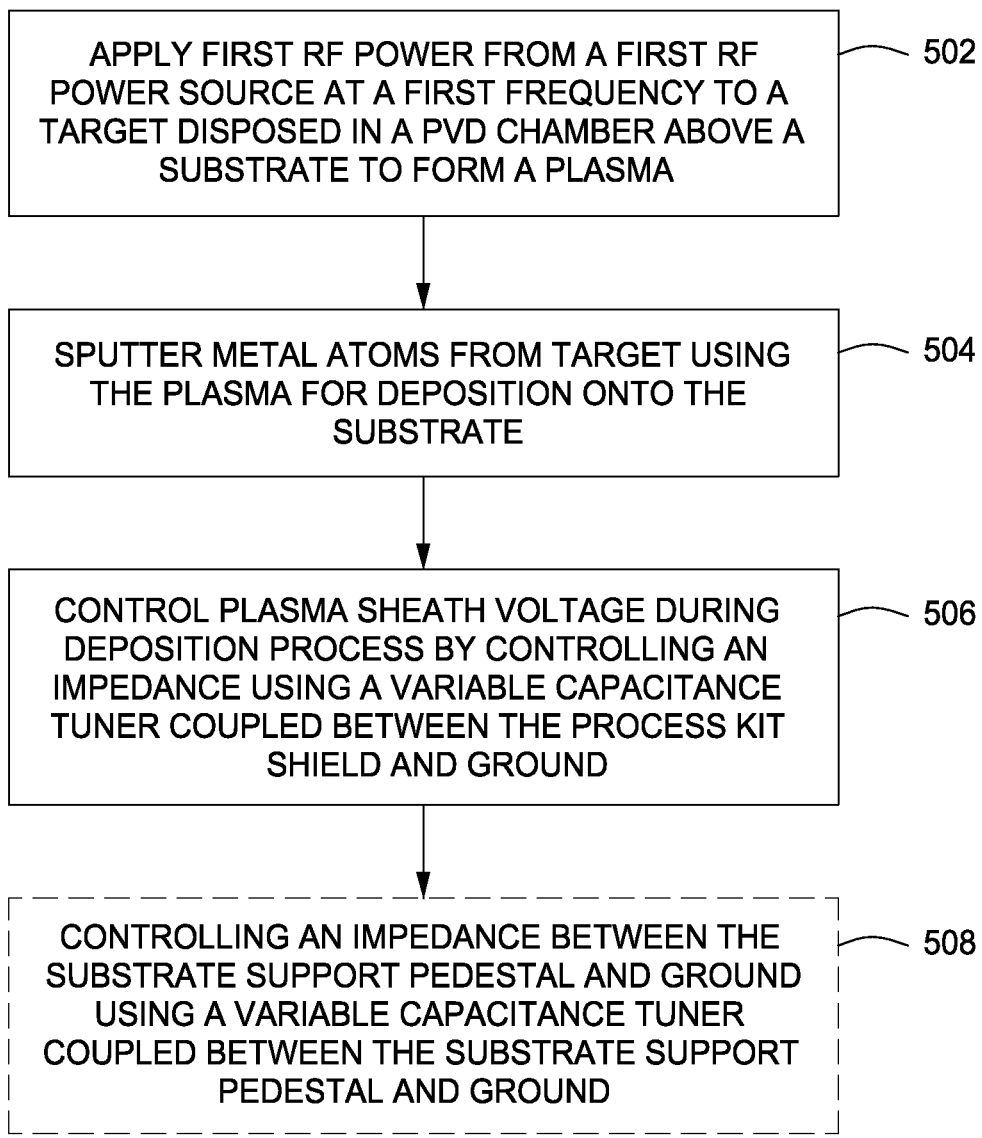
FIG. 5 depicts a flow chart for a method of depositing a metal-containing layer on a substrate in accordance with some embodiments of the present invention.

FIG. 5 depicts a flow chart for a method 500 of processing a substrate in a PVD chamber in accordance with some embodiments of the present invention. At 502, an first power at a first frequency from a first power source is applied to a target comprising a metal disposed in the PVD chamber above a substrate to form a plasma from a plasma-forming gas. At 504, metal atoms are sputtered from the target onto the substrate using the plasma. At 506, a plasma sheath voltage is controlled during sputtering process by controlling an impedance of the process kit shield using a variable capacitance tuner coupled between the process kit shield and ground such that the sputtered metal atoms are not deposited on the process kit shield. An impedance between the substrate support pedestal and ground may optionally be controlled at 508 using a variable capacitance tuner coupled between the substrate support pedestal and ground during processing of the substrate to further control the plasma sheath voltage.

In some embodiments, the capacitively tuned shield 174/474 discussed above with respect to FIGS. 1 and 4 may also be used during pasting and chamber conditioning processes. For example, in some embodiments, a pasting process may be performed in the PVD chamber. The impedance of the process kit shield may be controlled using the variable capacitance tuner to bias the shield such that pasting material is deposited on the process kit shield. In some embodiments, a chamber conditioning process may be performed in the PVD chamber. The impedance of the process kit shield may be controlled using the variable capacitance tuner to bias the shield such that unwanted material is removed from process kit shield.

While the foregoing is directed to embodiments of the present invention, other and further embodiments of the invention may be devised without departing from the basic scope thereof.

The invention claimed is:

1. A process kit shield used in a substrate processing chamber, comprising:
    a shield body having an inner surface and an outer surface;
    a process kit shield impedance match device coupled between the shield body and ground, wherein the process kit shield impedance match device is configured to adjust an impedance of the process kit shield, wherein the process kit shield impedance match device includes a plurality of process kit shield impedance match devices disposed equidistantly from each other about the perimeter of the process kit shield, and wherein each of the plurality of process kit shield impedance match devices is separately coupled to the shield body; and
    a cavity formed on the outer surface of the shield body configured to support one or more magnets when disposed therein.

2. The process kit shield of claim 1, wherein the one or more magnets are supported in the cavity of the process kit shield using dielectric supports.

3. The process kit shield of claim 1, wherein the one or more magnets are enclosed in a grounded metal box to shield the magnets from RF fields.

4. The process kit shield of claim 1, wherein the one or more magnets are electromagnets are configured to tune a uniformity of a plasma from a center of the plasma to an edge of the plasma, and to control a plasma diffusion in front of the process kit shield.

5. The process kit shield of claim 1, further comprising:
    a cover plate disposed over the cavity and having at least one fluid port configured to flow a coolant into and out of the cavity.

6. The process kit shield of claim 1, wherein the process kit shield impedance match device includes a control knob to adjust an impedance of the process kit shield.

7. Apparatus for use in a physical vapor deposition (PVD) chamber, comprising:
    a chamber body;
    a target disposed in the chamber body, the target comprising material to be deposited on a substrate when present;
    a substrate support pedestal disposed within the chamber body to support the substrate opposite the target during processing;
    a process kit shield disposed within the chamber body;
    a plurality of process kit shield impedance match devices disposed equidistantly from each other about the perimeter of the process kit shield, wherein each of the plurality of process kit shield impedance match devices is separately coupled to the process kit shield between the process kit shield and ground; and
    a plurality of dielectric isolators configured to electrically isolate the process kit shield from other components of the PVD chamber.

8. The apparatus of claim 7, wherein the process kit shield further comprises:
    a shield body having an inner surface and an outer surface; and
    a cavity formed on the outer surface of the shield body.

9. The apparatus of claim 8 further comprising:
    a cover plate disposed over the cavity and having at least one fluid port configured to flow a coolant into and out of the cavity.

10. The apparatus of claim 8, wherein one or more magnets are disposed in the cavity of the shield body.

11. The apparatus of claim 10, wherein the one or more magnets are electromagnets.

12. The apparatus of claim 10, wherein the one or more magnets are supported in the cavity of the process kit shield using dielectric supports.

13. The apparatus of claim 7, wherein each of the plurality the process kit shield impedance match devices include a manual control knob to adjust an impedance of the process kit shield.

14. The apparatus of claim 7, further comprising a controller coupled to each of the process kit shield impedance match devices and configured to control an impedance of the process kit shield.

15. The apparatus of claim 7, further comprising a pedestal impedance match device coupled between the substrate support pedestal and ground, wherein the pedestal impedance match device is configured to adjust a bias voltage on the substrate support pedestal.

16. The apparatus of claim 7, further comprising a target impedance match device coupled between the target and ground, wherein the target impedance match device is configured to adjust a bias voltage on the target.

* * * * *